United States Patent [19]
Murakami

[11] Patent Number: 5,483,093
[45] Date of Patent: Jan. 9, 1996

[54] INPUT PROTECTION DEVICE FOR ELECTRONIC DEVICE

[75] Inventor: Koichi Murakami, Yokosuka City, Japan

[73] Assignee: Nissan Motor Co., Ltd., Yokohama City, Japan

[21] Appl. No.: 162,544

[22] Filed: Dec. 6, 1993

Related U.S. Application Data

[62] Division of Ser. No. 911,689, Jul. 13, 1992, abandoned.

[30] Foreign Application Priority Data

Jul. 11, 1991 [JP] Japan ..................... 3-197038

[51] Int. Cl.$^6$ ................................. H01L 29/90
[52] U.S. Cl. .................. 257/355; 257/356; 257/362; 257/363
[58] Field of Search ................. 257/106, 355, 257/362, 363, 356

[56] References Cited

U.S. PATENT DOCUMENTS

| | | | |
|---|---|---|---|
| 4,254,442 | 3/1981 | Dijkmans et al. | 361/56 |
| 4,761,566 | 8/1988 | Inoue et al. | 307/262 |
| 5,014,155 | 5/1991 | Abe et al. | 361/56 |
| 5,027,181 | 6/1991 | Larik et al. | 257/355 X |
| 5,223,737 | 6/1993 | Canclini | 257/362 X |

FOREIGN PATENT DOCUMENTS

| | | | |
|---|---|---|---|
| 61-100954 | 5/1986 | Japan | 257/362 |
| 62-81048 | 4/1987 | Japan | 257/362 |
| 63-260160 | 10/1988 | Japan | 257/362 |
| 2-2202 | 1/1990 | Japan . | |

*Primary Examiner*—William Mintel
*Attorney, Agent, or Firm*—Lowe, Price, LeBlanc & Becker

[57] ABSTRACT

An input protection device comprises a current limiting resistor externally connected to an integrated circuit which includes two Zener diodes, one functioning as a power supply Zener diode and the other functioning as a ground Zener diode. Owing to the resistance of the current limiting resistor and junction capacitances of the Zener diodes, electromagnetic interference noise is effectively damped or attenuated.

2 Claims, 2 Drawing Sheets

500
INPUT PROTECTION DEVICE FOR ELECTRONIC DEVICE

This application is a division of application Ser. No. 07/911,689 filed Jul. 13, 1992, now abandoned.

BACKGROUND OF THE INVENTION

The present invention relates to an input protection device for an electronic device, and more particularly to an input protection device for protecting an electronic device used in an automobile from destructive breakdown and/or malfunction owing to electromagnetic interference and/or high frequency surge.

Electronic devices mounted on an automobile are subject to harsh operating environments. Thus, an input protection device is needed to prevent breakdown and/or malfunction of the electronic devices. Demands on such an input protection device are:

(1) Suppression of high frequency surge, of the order of several hundread voltages, induced by induction load in order to protect the electronic device from destructive breakdown; and (2) Elimination of electromagnetic interference noise and/or high frequency noise pulse owing to the above-mentioned surge in order to protect the electronic device from malfunction.

U.S. Pat. No. 5,014,155 issued to Abe et al. on May 7, 1991 discloses an input protection device in FIGS. 1, 2 and 3. This known input protection device is adapted to be connected between a switch and an electronic device and circuited between a power supply and ground. The switch is grounded. The input protection device has a current switch, and a circuit. The circuit includes an input terminal for externally connecting with the opposite end of the current limiting resistor and an output terminal for external connection with the electronic device. The circuit includes a power supply diode having an anode connected to the input terminal and a cathode connected to the power supply, a ground diode having an anode connected to the ground and a cathode connected to the input terminal, a bias or pull-up resistor having one end connected to the input terminal and an opposite end connected to the power supply, a capacitor having one side connected to the input terminal and an opposite side connected to the ground, and circuit elements coupling the input terminal with the output terminal. The circuit elements include a comparator having a signal input connected to the one side of the capacitor and a reference input. The elements of the circuit are integrated and formed on a semiconductor substrate. When a high frequency surge is applied to the device and superimposed on an output of the switch, this surge is clamped owing to the power supply and ground diodes and then damped by a filter composed of the current limiting resistor and the capacitor. In order to improve the performance of this filter, it is conceivable to increase the capacitance of the capacitor, since the resistance of the current limiting resistor is limited to such a low level as to allow an electric current above a predetermined value (on order of 1 to 2 mA) to pass through the input terminal, in order to insure conduction through oxidized film formed on the external connection of the circuit to the current limiting resistor.

Assuming that a sufficiently high degree of capacitance is formed in the semiconductor substrate by an ordinary MOS capacitor, it is necessary to provide an input resistor to protect the MOS capacitor from electrostatic destructive breakdown. The provision of the input resistor induces direct-current (DC) regeneration upon application of high frequency surge. This DC regeneration causes a shift in input voltage level. Thus, there may occur a malfunction wherein the output of the comparator switches from a high level to a low level upon application thereto of a high frequency surge when the switch is open, since a voltage applied to the signal input of the comparator may drop below the reference voltage owing to the above-mentioned DC regeneration.

Forming a clamping circuit with the power supply diode and ground diode poses a problem in that, since it is difficult to maintain either a uniform junction capacitance or a uniform capacitance versus voltage characteristic, product-to-product variability is ineligible.

An object of the present invention is to provide an input protection device which, with a reduced number of component parts, provides a capacitance sufficiently great for damping electromagnetic interference noise without causing occurrence of malfunction upon application thereto of high frequency surge.

SUMMARY OF THE INVENTION

According to one aspect of the present invention, there is provided an input protection device adapted to be connected between a switch and an electronic device and circuited between a power supply and ground, the input protection device comprising:

a current limiting resistor having one end adapted to be connected to the switch and an opposite end; and a circuit including input means for externally connecting with said opposite end of said current limiting resistor and output means adapted for externally connecting with the electronic device;

said circuit including, a first Zener diode having an anode connected to said input means and a cathode adapted to be connected to the power supply; and a second Zener diode having an anode adapted to be connected to the ground and a cathode connected to said input means.

According to another aspect of the present invention, in an input protection device adapted to be connected between a switch and an electronic device and circuited between a power supply and ground, the input protection device including a current limiting resistor having one end connected to the switch and an opposite end, there are provided:

a semiconductor substrate of semiconductive material of one conductive type, said semiconductor substrate having a surface;

a first well region extending into said semiconductor substrate from said surface and forming a first PN junction with the surrounding portions of said semiconductor substrate;

a second region of the same type as and of higher impurity concentration than the remainder of said first well region extending into said surface within said first well region;

a third region of the same type as and of higher degree of diffusion than the remainder of said semiconductor substrate extending into said surface within said first well region and forming a second PN junction with said second region;

a fourth region of the same type as and of higher impurity concentration than the remainder of said first well region extending into said surface at one end of said first well region and forming a third PN junction with the portions of said semiconductor substrate adjacent said first well region;

a fifth well region extending into said semiconductor substrate from said surface and forming a fourth PN junction with the surrounding portions of said semiconductor substrate;

a sixth region of the same type as and of higher impurity concentration than the remainder of said fifth well region extending into said surface within said fifth well region;

a seventh region of the same type as and of higher impurity concentration than the remainder of said semiconductor substrate extending into said surface within said fifth well region and forming a fifth PN junction with said sixth region; and an eighth region of the same type as and of higher impurity concentration than the remainder of said fifth well region extending into said surface at one end of said fifth well region and forming a sixth PN junction with the portions of said semiconductor substrate adjacent said fifth well region.

DETAILED DESCRIPTION OF THE INVENTION

Figure 1:
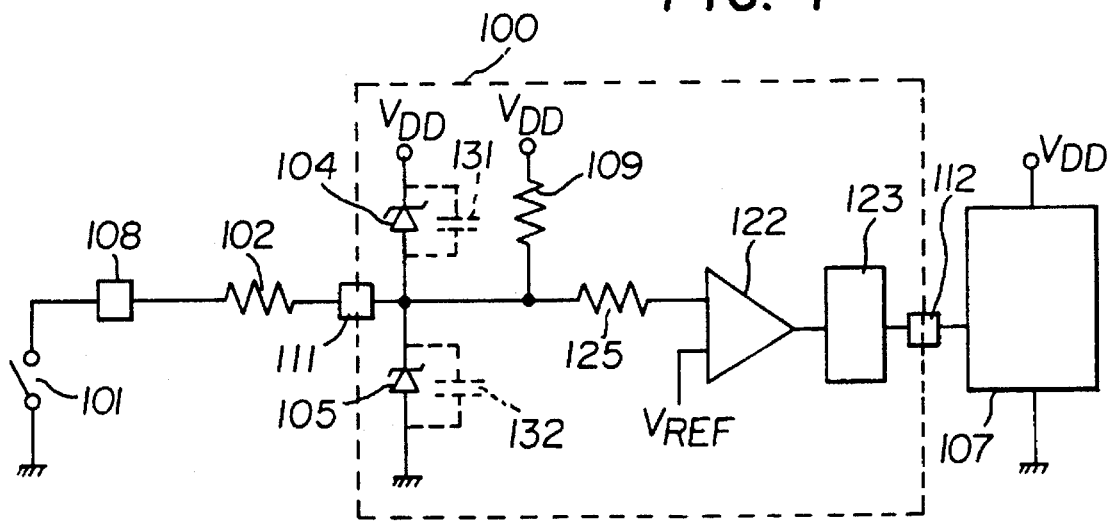
FIG. 1 is a schematic representation of a first embodiment of an input protection device connected between a switch (connected to ground) and an electronic device to be protected.
Figure 2:
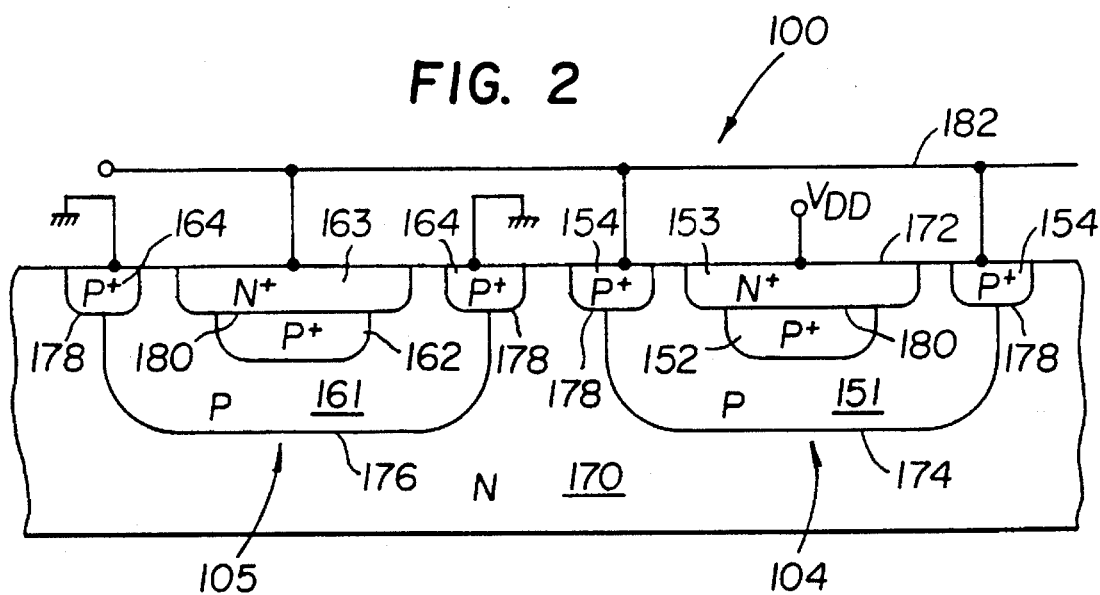
FIG. 2 is a diagrammatic cross section of a portion of an integrated circuit of the input protection device.

Referring to FIGS. 1 and 2, FIG. 2 shows a portion of an integrated circuit (IC) 100 of circuit elements which is shown in FIG. 1 as enclosed by a broken line rectangle 100. This device 100 may be made by conventional processes in a semiconductor substrate 170, which has a surface 172 adjacent to which are a plurality of regions forming diffused-type semiconductor Zener diodes 104 and 105.

Referring to FIG. 2, regions are formed adjacent to the surface 172 to define first and second Zener diodes 104 and 105. In this example, the semiconductor substrate 170 is of one type conductivity, e.g., N type. There are well regions 151 and 161 of P type conductivity in the semiconductor substrate 170. Among them, the first well region 151 extends into the semiconductor substrate 170 from the surface 172 and forms a PN junction 174 with the surrounding portions of the semiconductor substrate 170, while the second well region 161 extends into the semiconductor substrate 170 from the surface 172 and forms a PN junction 176 with the surrounding portions of the semiconductor substrate 170. Highly doped P type regions (P+) 154 and 164 are adjacent to the edges of the well regions 151 and 161. Each of the regions 154 and 164 extends into the surface 172 at one end of the adjacent one of the well regions 151 and 161 and forms a third PN junction 178 with the portions of the semiconductor substrate 170 adjacent the well region 151 or 161. There are other highly doped P type regions (P*) 152 and 161 in the well regions 151 and 161, respectively. The regions 152 and 162 extend into the surface 172 deeply within the well regions 151 and 161, respectively. Disposed between the regions 154 and between the regions 164 are highly doped N type regions (N+) 153 and 163. Each of the regions 153 and 163 extends into the surface 172 within the adjacent well regions 151 and 161 and forms a PN junction 180 with the adjacent one of the regions 152 and 162. Referring also to FIG. 1, in operation, the regions 154 function as an anode of the Zener diode 104, while the region 153 functions as a cathode of the Zener diode 104. The region 163 functions as a cathode of the Zener diode 105, while the regions 164 function as an anode of the Zener diode 105. The regions 154 and 163 are connected to a conductor 182 forming an input terminal as indicated at 111 in FIG. 1. The region 153 forming the cathode of the Zener diode 104 is connected to a power supply providing a source voltage $V_{DD}$. The regions 164 forming the anode of the Zener diode 105 are grounded. In FIG. 1, the Junction capacitance at the PN junction 180 formed by the regions 152 and 153 is shown by a phantom line as an imaginary capacitor 131, and the junction capacitance at the PN junction 180 formed by the regions 162 and 163 is shown by a phantom line as an imaginary capacitor 132 for ease of explanation.

FIG. 1 is a schematic equivalent circuit of the device according to the present invention and shows further circuit elements to be integrated. In FIG. 1, an electronic device to be protected is indicated by the reference numeral 107, and a switch of a signal input line or channel is indicated by the reference numeral 101. The switch 101 is of the grounded type having one terminal grounded. The reference numeral 108 indicates a wiring connector. As shown in FIG. 1, the input protection device is connected between the switch 101 and electronic device 107. In order to protect the integrated circuit (IC) 100 from a high voltage input, the device comprises a current limiting resistor 102 having one end connected to the switch 101 via the wiring connector 108 and an opposite end externally connected to the input terminal 111 of the circuit 100. The electronic device 107 has an input externally connected to an output terminal 112 of the circuit 100. In this example, the circuit 100 includes, in addition to the Zener diodes 104 and 105, a bias resistor 109, a comparator 122, a resistor 125 for the comparator 122 and a sampling circuit 123. The first Zener diode 104 is the power supply Zener diode having its anode, i.e, regions 154 in FIG. 2, connected to the input terminal 111 and its cathode, i.e., region 153 in FIG. 2 connected to the power supply $V_{DD}$. The second Zener diode 105 is the ground Zener diode having its anode, i.e., regions 164 in FIG. 2, connected to the ground and its cathode, i.e., region 163 in FIG. 2, connected to the input terminal 111. In order to insure electric current passing through the switch 101, the resistor 109 has one end connected to the input terminal 111 and an opposite end connected to the power supply $V_{DD}$. Thus, this resistor 109 may be called a pull-up resistor. The circuit elements 122, 123 and 125 couple the input terminal with the output terminal.

Explaining further the circuit elements, the comparator has an input connected via the resistor 125 to the input terminal 111 and a reference input to which a reference voltage $VRE_F$ is applied. The resistor 125 serves as a buffer resistor having one end connected to the input terminal 111 and an opposite end connected to the input of the comparator 122. Since an input voltage $V_{IN}$ at the input terminal 111 is determined by the ratio of the resistance of the current limiting resistor 102 to the resistance of the pull-up resistor 109, the setting is such that the reference voltage $VRE_F$ is as high as a voltage which is approximately at the middle between the input voltage $V_{IN}$ and the power supply voltage $V_{DD}$ but higher than one half of the power supply voltage $V_{DD}$ (0.5 $V_{DD}$).

The capacitance per unit area of each of the Zener diodes 104 and 105 owing to the PN junction 180 is three to five times greater than that of the diffused type semiconductor diode and gives a noise filter which is of very good performance in cooperation with the resistance of the current limiting resistor 102, in damping electromagnetic interference noise.

Upon application of a high frequency surge to the device, the Zener diodes 104 and 105 clamp the surge. The clamped surge does not cause direct-current regeneration since there is no filter after the Zener diodes 104 and 105. Thus, no malfunction of the comparator 122 is induced.

In this example, the power supply and ground Zener diodes are formed in the same manner by the same process so that both of the Zener diodes have the same Zener voltage, the same junction capacitance per unit area and the same voltage dependent junction capacitance. These features are advantageous in design and manufacture of the integrated circuit.

In the above embodiment, the switch 101 is grounded and the pull-up resistor 109 is used. However, the input protection device may be connected between a switch connected to a power supply and an electronic circuit wherein the bias resistor 109 is used as a pull-down resistor. This example is illustrated in FIG. 3 as the second embodiment.

Figure 3:
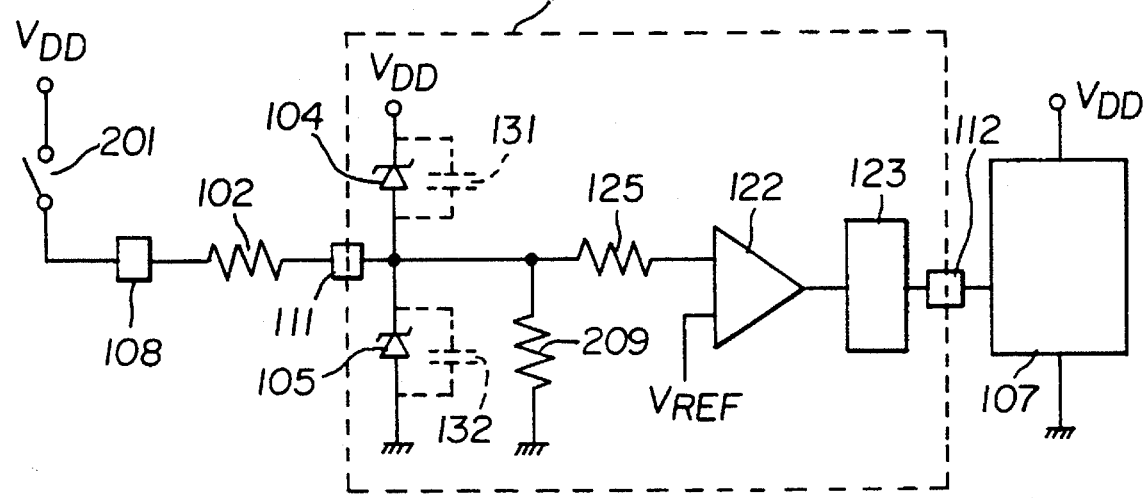
FIG. 3 is a similar view to FIG. 1 showing a second embodiment of an input protection device (connected between a switch connected to a power supply) and an electronic device to be protected.

Referring to FIG. 3, a switch 201 is connected to a power supply $V_{DD}$. This embodiment of an input protection device is substantially the same as the first embodiment except that a bias resistor 209 is used as a pull-down resistor having one end connected to an input terminal 111 and an opposite end grounded.

Let us now consider the case where the input protection device is to be connected to individual signal input lines to the electronic device signal, which signal input lines have individual switches connected to the power supply. In this case, the bias resistors are circuited as pull-down resistors. Upon application to this circuit arrangement of a surge with positive polarity, the power supply Zener diodes are forwardly biased to induce inflow of surge electric current to the semiconductor substrate, This surge current flows through the region of the P type connected to the adjacent signal input line into the pull-down resistor. This may cause a malfunction to occur.

Figure 4:
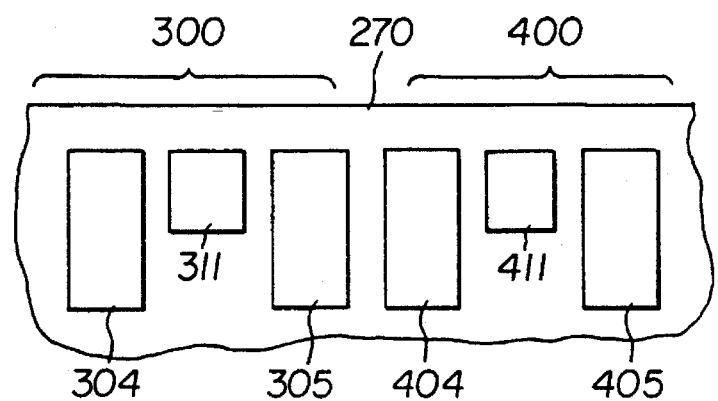
FIG. 4 is a diagrammatic view of a portion of an integrated circuit designed for connection with multi-line signal input arrangement to an electronic device.

FIG. 4 shows an arrangement of a power supply and ground Zener diodes in a semiconductor substrate, which is effective to prevent occurrence of the above-mentioned malfunction. Referring to FIG. 4, the reference numerals 300 and 400 indicate circuit elements to be connected to the adjacent two signal input lines. In order to prevent malfunction owing to the surge current, the power source Zener diodes 304 and 404 for the adjacent two signal input lines 300 and 400 are arranged in an interleaved manner with the ground Zener diodes 305 and 405 for these signal lines 300 and 400 in a semiconductor substrate 270 of N type. Disposed between the power supply and ground Zener diodes 304 and 305 is an input pad 311 for the signal input line 300. Disposed between the power supply and ground Zener diodes 404 and 405 is an input pad 411 for the signal input line 400. This arrangement is effective in minimizing the effect owing to application of surge.

In the preceding description, semiconductor substrates 170 and 270 of N type are used. However, a semiconductor substrate of P type may be used by converting the polarities of the regions.

What is claimed is:

1. In an input protection device adapted to be connected between a switch and an electronic device and circuited between a power supply and ground, the input protection device including a current limiting resistor having one end connected to the switch and an opposite end:

a semiconductor substrate (170) of one conductive type, said semiconductor substrate having a surface;

a first well region (151) extending into said semiconductor substrate from said surface and forming a first PN junction with the surrounding portions of said semiconductor substrate;

a second region (152) of the same type as and of higher impurity concentration than the remainder of said first well region (151) extending into said surface within said first well region (151);

a third region (153) of the same type as and of higher impurity concentration than the remainder of said semiconductor substrate extending into said surface within said first well region (151) and forming a second PN junction with said second region (152);

a fourth region (154) of the same type as and of higher impurity concentration than the remainder of said first well region (151) extending into said surface at one end of said first well region and forming a third PN junction with the portions of said semiconductor substrate adjacent said first well region a fifth well region (161) extending into said semiconductor substrate from said surface and forming a fourth PN junction with the surrounding portions of said semiconductor substrate (170);

a sixth region (162) of the same type as and of higher impurity concentration than the remainder of said fifth well region (161) extending into said surface within said fifth well region (161);

a seventh region (163) of the same type as and of higher impurity concentration than the remainder of said semiconductor substrate (170) extending into said surface within said fifth well region (161) and forming a fifth PN junction with said sixth region (162); and an eighth region (164) of the same type as and of higher impurity concentration than the remainder of said fifth well region (161) extending into said surface at one end of said fifth well region and forming a sixth PN junction with the portions of said semiconductor substrate (170) adjacent said fifth well region (161).

2. An input protection device as set forth in claim 1, wherein when said third region (153) is connected to the power supply ($V_{DD}$), said fourth region (154) is connected to the opposite end of the to current limiting resistor, said seventh region (163) is connected to the opposite end of the current limiting resistor, and said eighth region (164) is connected to the ground, said second PN junction formed by said second and third regions (152, 153) and said fifth PN junction formed by said sixth and seventh regions (162, 163) serve as a power supply Zener diode and a ground Zener diode.

\* \* \* \* \*